(12) United States Patent
Bruce et al.

(10) Patent No.: US 10,712,308 B2
(45) Date of Patent: Jul. 14, 2020

(54) BIOSENSOR FOR ELECTRICAL DETECTION OF A NUCLEOTIDE SEQUENCE

(71) Applicant: INTERNATIONAL BUSINESS MACHINES CORPORATION, Armonk, NY (US)

(72) Inventors: Robert L. Bruce, White Plains, NY (US); Payel Das, Yorktown Heights, NY (US); HsinYu Tsai, White Plains, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 582 days.

(21) Appl. No.: 15/172,759

(22) Filed: Jun. 3, 2016

(65) Prior Publication Data

US 2017/0350855 A1 Dec. 7, 2017

(51) Int. Cl.
*B82Y 15/00* (2011.01)
*G01N 27/414* (2006.01)
*H01L 23/532* (2006.01)
*G01N 27/327* (2006.01)

(52) U.S. Cl.
CPC ....... *G01N 27/4145* (2013.01); *G01N 27/327* (2013.01); *H01L 23/53242* (2013.01)

(58) Field of Classification Search
CPC .............. H01L 21/02603; H01L 21/32; H01L 27/0924; B82Y 15/00
USPC .................................................. 977/721, 704
See application file for complete search history.

(56) References Cited

U.S. PATENT DOCUMENTS

| 5,821,060 A | 10/1998 | Arlinghaus et al. |
| 6,342,359 B1 | 1/2002 | Lee et al. |
| 7,101,671 B2 | 9/2006 | Gao |

(Continued)

OTHER PUBLICATIONS

Anne et al., "Dynamics of Electron Transport by Elastic Bending of Short DNA Duplexes. Experimental Study and Quantitative Modeling of the Cyclic Voltammetric Behavior of 3'-Ferrocenyl DNA End-Grafted on Gold," J. Am. Chem. Soc. 2006, Copyright 2006 American Chemical Society, pp. 542-557.

(Continued)

*Primary Examiner* — Natalia Levkovich
(74) *Attorney, Agent, or Firm* — Reza Sarbakhsh

(57) ABSTRACT

The present invention relates generally to the field of microelectronics, and more particularly to a structure and method of forming a biosensor having a nucleotide attracting surface formed to reduce false detection of nucleotides and enabling electrical detection of nucleotides. The biosensor may include an analyte-affinity layer on an upper surface of a substrate. A conductive layer may extend a length of the substrate below and in contact with the analyte-affinity layer. The conductive layer may be electrically connected to one or more transistors. The analyte-affinity layer may have dimensions tailored for a target analyte. A distance between a first analyte-affinity layer and a second analyte-affinity layer may range from approximately 50% of a length of a target analyte to approximately 300% of a length of a target analyte. The analyte-affinity layer may have an upper surface with a diameter ranging from approximately 3 nm to approximately 20 nm.

16 Claims, 23 Drawing Sheets

(56) References Cited

U.S. PATENT DOCUMENTS

| | | | |
|---|---|---|---|
| 2003/0013203 A1* | 1/2003 | Jedrzejewski | B01J 19/0046 436/102 |
| 2004/0028875 A1 | 2/2004 | Van Rijn et al. | |
| 2004/0101845 A1 | 5/2004 | Collins et al. | |
| 2004/0101846 A1 | 5/2004 | Collins et al. | |
| 2005/0095596 A1 | 5/2005 | Leproust et al. | |
| 2007/0099198 A1 | 5/2007 | Hassibi et al. | |
| 2008/0027654 A1 | 1/2008 | Nelson et al. | |
| 2010/0234235 A1 | 9/2010 | Kaplan | |
| 2016/0281149 A1 | 9/2016 | Hassibi et al. | |

OTHER PUBLICATIONS

Kaiser et al., "Conformations of End-Tethered DNA Molecules on Gold Surfaces: Influences of Applied Electric Potential, Electrolyte Screening, and Temperature," J. Am. Chem. Soc. 2010, Copyright 2010 American Chemical Society, pp. 7935-7945.

Li et al., "Separation of DNA with Different Configurations on Flat and Nanopatterned Surfaces," Analytical Chemistry, vol. 78, No. 14, Jul. 15, 2006, Copyright 2006 American Chemical Society, pp. 4743-4751.

Peterson et al., "The effect of surface probe density on DNA hybridization," Nucleic Acids Research, 2001, vol. 29, No. 24, Copyright 2001 Oxford University Press, pp. 5163-5168.

Petrovykh et al., "Quantitative Analysis and Characterization of DNA Immobilized on Gold," J. Am. Chem. Soc., 2003, Copyright 2003 American Chemical Society, pp. 5219-5226.

Relogio et al., "Optimization of oligonucleotide-based DNA microarrays," Nucleic Acids Research, 2002, vol. 30, No. 11, Copyright 2002 Oxford University Press, pp. 1-10.

Sakata et al., "Potential Behavior of Bio-chemically Modified Gold Electrode for Extended Gate Field Effect Transistor," National Institute for Materials Science, Tsukuba, Ibaraki, Japan, Japanese Journal of Applied Physics (Impact Factor: 1.13), DOI: 10.1143/JJAP.44.2860, pp. 1-4.

Zhou et al., "Use of Atomic Force Microscopy for Making Addresses in DNA Coatings," Langmuir 2002 Copyright 2002 American Chemical Society, Published on Web Sep. 26, 2002, pp. 8278-8281.

Ruiz et al., "Density Multiplication and Improved Lithography by Directed Block Copolymer Assembly," Science, vol. 321, Aug. 15, 2008, pp. 936-939.

Cheng et al., "Pattern Registration Between Spherical Block-Copolymer Domains and Topographical Templates," Adv. Mater., 2006, vol. 18, Copyright 2006 Wiley-VCH GmbH & Co. KGaA, Weinheim, pp. 597-601.

Cheng et al., "Templated Self-Assembly of Block Copolymers: Effect of Substrate Topography," Adv. Mater., 2003, vol. 15, No. 19, Oct. 2, 2003, Copyright 2003 Wiley-VCH GmbH & Co. KGaA, Weinheim, pp. 1599-1602.

Das et al., "Mechanistic Influence of Nanometer Length-Scale Surface Chemistry on DNA Hybridization," ACS Nano, vol. 9, No. 7, Jun. 8, 2015, pp. 7466-7478, Grace Period Disclosure.

Chen et al., "Ionic strength-dependent persistence lengths of single-stranded RNA and DNA," PNAS, vol. 109, No. 3, Jan. 17, 2012, pp. 799-804.

Rechendorff et al., "Persistence length and scaling properties of single-stranded DNA adsorbed of modified graphite," The Journal of Chemical Physics, 131, 095103, 2009, Copyright 2009 American Institute of Physics, pp. 1-6.

Koltai et al., "Specificity of DNA microarray hybridization: characterization, effectors and approaches for data correction," Nucleic Acids Res., Apr. 2008; 36(7), Copyright 2008 the Author(s), pp. 2395-2405.

Fiche et al., "Temperature Effects on DNA Chip Experiments from Surface Plasmon Resonance Imaging: Isotherms and Melting Curves," Biophys J., Feb. 1, 2007; 92(3), Copyright 2007, Biophysical Society, pp. 935-946.

Chen et al., "Kinetics and thermodynamics of DNA hybridization on gold nanoparticles," Nucleic Acids Res., Jun. 2009; 37(11), Copyright 2009 the Author9(s), pp. 3756-3765.

Draghici et al., "Reliability and reproducibility issues in DNA microarray measurements," Trends Genet, Feb. 2006; 22(2), pp. 101-109.

Levicky et al., "Physicochemical perspectives on DNA microarray and biosensor technologies," Trends in Biotechnology, vol. 23, No. 3, Mar. 2005, Copyright 2005 Elsevier Ltd., pp. 143-149.

Chan et al., "The Biophysics of DNA Hybridization with Immobilized Oligonucleotide Probes," Biophysical Journal, vol. 69, Dec. 1995, Copyright 1995 by the Biophysical Society, pp. 2243-2255.

Dorvel et al., "Silicon Nanowires with High-k Hafnium Oxide Dielectrics for Sensitive Detection of Small Nucleic Acid Oligomers," HHS Public Access, Author manuscript, Published online Jun. 22, 2012, doi: 10.1021/nn301495k, http://www.ncbi.nlm.nih.gov/pmc/articles/PMC3412126/, Printed on Apr. 11, 2016, pp. 1-18.

Vora et al., "Directed Self-assembly of Topcoat-free, Integration-friendly High-X Block Copolymers," Journal of Photopolymer Science and Technology, vol. 27, No. 3 (2014), Copyright 2014PST, pp. 419-424.

Josephs et al., "Nanoscale Spatial Distribution of Thiolated DNA on Model Nucleic Acid Sensor Surfaces," ACS Nano, vol. 7., No. 4, Jospehs and Ye, Copyright 2013 American Chemical Society pp. 3653-3660.

Josephs et al., "Electric-Field Dependent Conformations of Single DNA Molecules on a Model Biosensor Surface," Nano Lett., 2012, Published: Sep. 10, 2012, Copyright 2012 American Chemical Society, pp. 5255-5261.

IBM: List of IBM Patents or Patent Applications Treated as Related (Appendix P), Jun. 6, 2016, pp. 1-2.

Bruce et al., Pending U.S. Appl. No. 15/172,737, filed Jun. 3, 2016, titled "Biosensor for Optical Detection of Nucleotide Sequence," pp. 1-36.

Bruce et al., Pending U.S. Appl. No. 15/172,801, filed Jun. 3, 2016, titled "Reduction of Surface Nucleotide Hybridization by Optimizing a Biosensor Sensing Surface Area," pp. 1-31.

IBM: List of IBM Patents or Patent Applications Treated as Related (Appendix P), Jul. 17, 2019, pp. 1-2.

Pending U.S. Appl. No. 16/454,203, filed Jun. 27, 2019, entitled: Reduction of Surface Nucleotide Hybridization by Optimizing a Biosensor Sensing Surface Area, 31 pages.

Mir et al., Abstract for "Sequence variation in genes and genomic DNA: methods for large-scale analysis", Annual Review of Genomics and Human Genetics (Annu Rev Genom Hum G), vol. 1, No. 1, pp. 329-360, Feb. 2000.

Homola, "Surface Plasmon Resonance Sensors for Detection of Chemical and Biological Species", Chem. Rev. 2008, vol. 108, pp. 462-493.

Liepold et al., "Electrically detected displacement assay (EDDA): a practical approach to nucleic acid testing in clinical or medical diagnosis", Anal Bioanal Chem (2008), vol. 391: pp. 1759-1772.

Hall, Book: "Biosensors", Prentice Hall advanced reference series: Engineering Against the Clock Biotechnology series, Prentice Hall 1991, 351 pages.

Schena, Overview of "Microarray Analysis", New York: Wiley-Liss, John Wiley & Sons, Inc., 2003, 654 pages, Clinical Chemistry, vol. 49, No. 6, 2003, pp. 1031-1033.

Edited by: Kazuaki Suzuki, Bruce W. Smith, "Microlithography", Science and Technology, Second Edition, CRC Press, 2007, Sidewall Image Transfer, pp. 93-94.

* cited by examiner

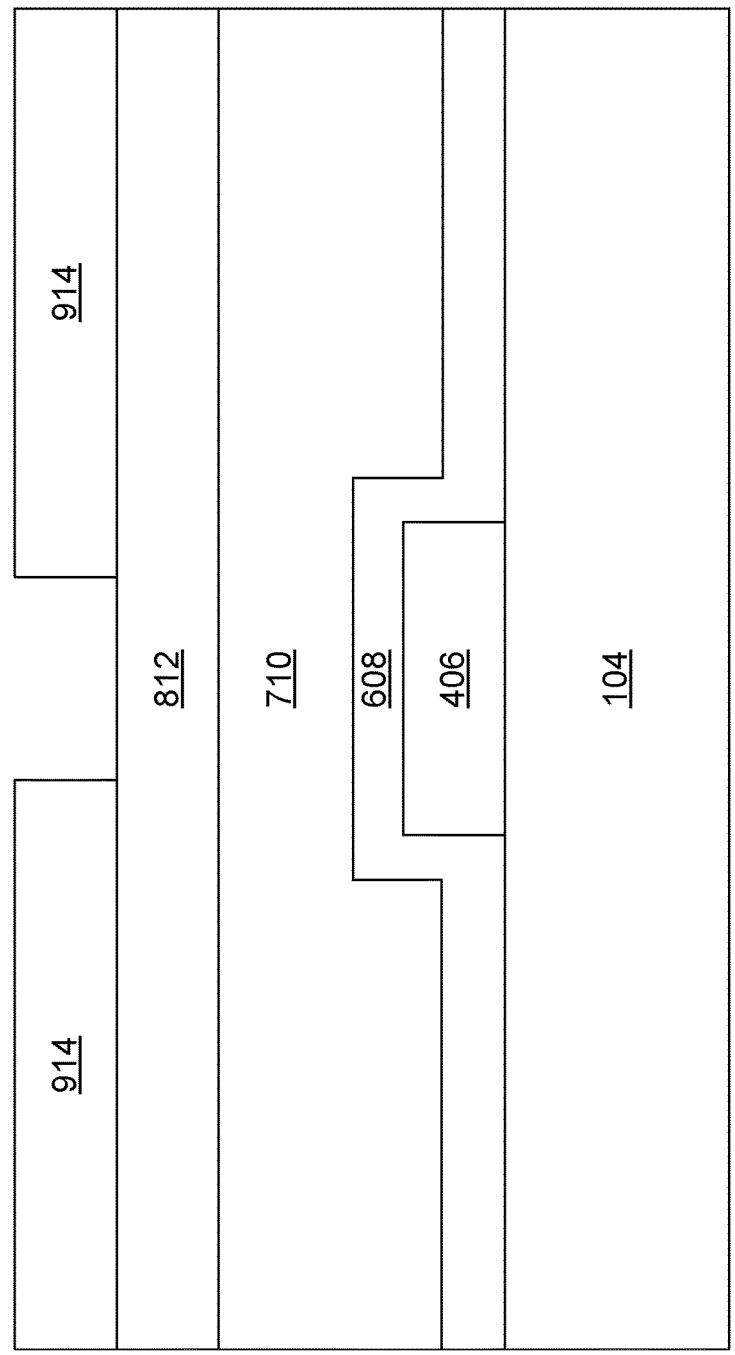

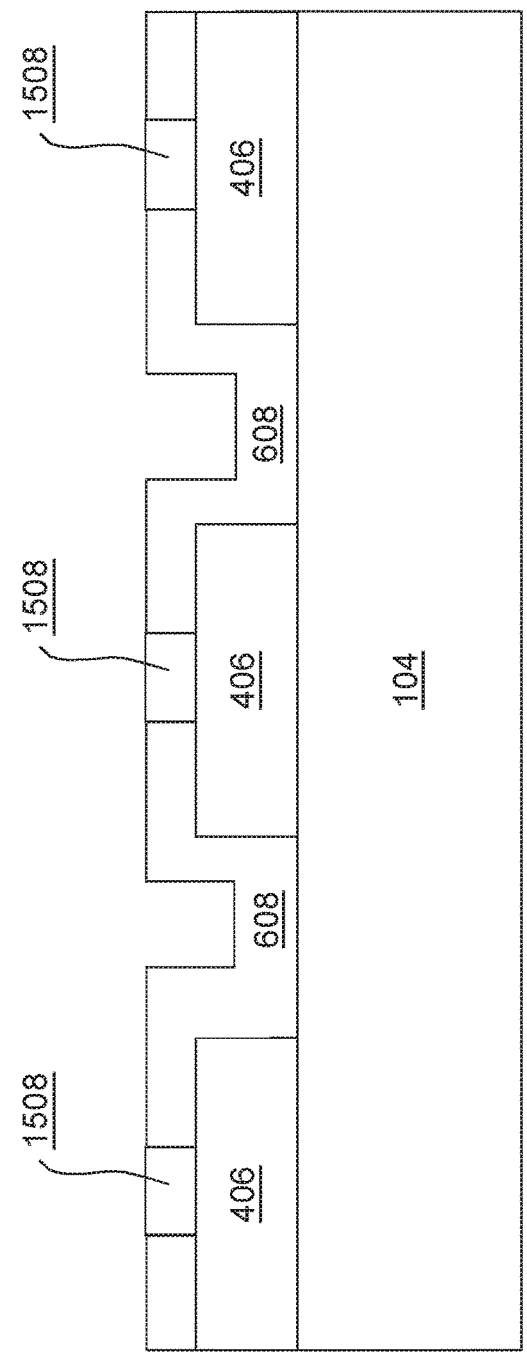

BIOSENSOR FOR ELECTRICAL DETECTION OF A NUCLEOTIDE SEQUENCE

Aspects of the present invention have been disclosed in a publication made available to the public on Jun. 8, 2015. Payel Das & Sufi Zafar, *Mechanistic Influence of Nanometer Length-Scale Surface Chemistry on DNA Hybridization,* 7466-478 (Jun. 8, 2015). The following disclosure is submitted under 35 U.S.C. § 102(b)(1)(A).

BACKGROUND

The present invention relates generally to the field of microelectronics, and more particularly to a structure and method of forming a biosensor having a nucleotide attracting surface tailored to reduce false detection of nucleotides and enabling electrical detection of nucleotides.

Affinity-based biosensors may be used to identify and measure one or more analytes (e.g., proteins, nucleotides, etc.) in a sample. Selective interactions between an analyte and a surface of a biosensor may be exploited to attract a particular analyte to the surface of the biosensor. Affinity-based biosensors may be used in parallel (e.g., as in microarrays) to detect a large number of analytes at once.

SUMMARY

Embodiments of the present invention disclose a method of forming a biosensor having a nucleotide attracting surface tailored to reduce false detection of nucleotides. The method may include forming a first photoresist layer on an upper surface of a substrate. The method may include removing a portion of the first photoresist layer along a length of the substrate exposing an upper surface of the substrate. The method may include forming a conductive layer on the exposed upper surface of the substrate. The method may include removing the first photoresist layer. The method may include forming a dielectric layer on an upper surface of the substrate and on an upper surface of the conductive layer. The method may include forming a first hardmask on an upper surface of the dielectric layer. The method may include forming a second hardmask on an upper surface of the first hardmask. The method may include forming a second photoresist layer on an upper surface of the second hardmask. The method may include removing a portion of the second photoresist layer exposing an upper surface of the second hardmask. The method may include removing a portion of the second hardmask exposing an upper surface of the first hardmask. The method may include removing a portion of the first hardmask exposing an upper surface of the dielectric layer where an area of the exposed upper surface of the dielectric layer is smaller than an area of the exposed upper surface of the exposed upper surface of the first hardmask. The method may include removing a portion of the dielectric layer exposing an upper surface of the conductive layer. The method may include forming an analyte-affinity layer on the exposed upper surface of the conductive layer. The method may include removing the second photoresist layer, the second hardmask, and the first hardmask.

Embodiments of the present invention disclose a method of forming a biosensor having a nucleotide attracting surface tailored to reduce false detection of nucleotides. The method may include forming a conductive layer on an upper surface of a substrate where the conductive layer extends a length of the substrate. The method may include forming a dielectric layer on an upper surface of the substrate and on an upper surface of the conductive layer. The method may include forming a first hardmask on an upper surface of the dielectric layer. The method may include forming a second hardmask on an upper surface of the first hardmask. The method may include removing a cylindrical portion of the second hardmask exposing an upper surface of the first hardmask. The method may include removing a portion of the first hardmask exposing an upper surface of the dielectric layer where an area of the exposed upper surface of the dielectric layer is smaller than an area of the exposed upper surface of the exposed upper surface of the first hardmask. The method may include removing a cylindrical portion of the dielectric layer exposing an upper surface of the conductive layer. The method may include forming an analyte-affinity layer on the exposed upper surface of the conductive layer. The method may include removing the second hardmask and the first hardmask.

Embodiments of the present invention disclose a structure having a nucleotide attracting surface tailored to reduce false detection of nucleotides. The structure may include a conductive layer on an upper surface of a substrate extending a length of the substrate. The structure may include a dielectric layer on an upper surface of the substrate and on an upper surface of the conductive layer. The structure may include an analyte-affinity layer on an upper surface of the conductive layer. The analyte-affinity layer may be surrounded by and in contact with the dielectric layer. The analyte-affinity layer may have a cylindrical shape. The analyte-affinity layer include gold.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

FIGS. 10A-10B are a cross-section view and a top view, respectively, of removing a portion of the second photoresist layer, in accordance with an embodiment of the present invention.

FIGS. 16A-16B are a cross-section view and a top view, respectively, of removing a portion of dielectric layer, in accordance with an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
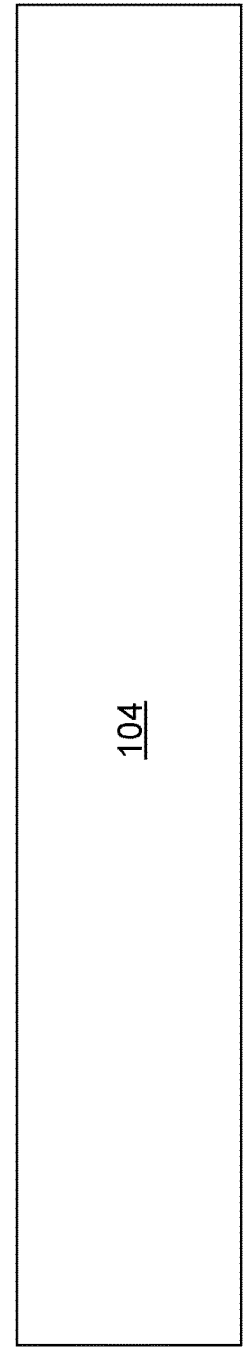
FIG. 1 is a cross-section view of a structure, in accordance with an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to the field of microelectronics, and more particularly to a structure and method of forming a biosensor having a nucleotide attracting surface tailored to reduce false detection of nucleotides and enabling electrical detection of nucleotides. Affinity-based biosensors may be used to identify and measure one or more analytes (e.g., proteins, nucleotides, etc.) in a sample. Selective interactions between an analyte and a surface of a biosensor may be exploited to attract a particular analyte to the surface of the biosensor. Affinity-based biosensors may be used in parallel (e.g., as in microarrays) to detect a large number of analytes at once.

Conventional affinity-based biosensor structures may result in a number of false positives and false negatives (e.g., incorrectly identifying a presence or absence of an analyte). In an embodiment, an analyte (e.g., a nucleotide sequence) in contact with a surface of biosensor may partially interact with a complimentary analyte (e.g., a complementary nucleotide sequence) or another analyte and result in a false positive. An affinity-based biosensor may include a gold surface. Gold may be used to study the interactions governing surface hybridization due to its useful properties as a model substrate. However, hybridization on gold is affected by nonspecific adsorption of the exposed bases of small strand DNA or ss-DNA. Nonspecific DNA gold interaction is found to be base-dependent, following the order A>G>C>T. Typical probe sequences (nucleotides) at low surface densities exhibit hybridization efficiency of greater than 60% that is lower than what is observed in solution. A planar gold surface has been reported to significantly slow down and lower free energy of hybridization. Studies also suggested incomplete hybridization on gold. Due to typical probe sequences non-specific interactions with gold, the use of gold to increase the sensitivity and accuracy of probe-gold interactions is not an obvious solution.

Embodiments of the present invention provide a structure and method for forming a biosensor with an attractive surface having dimensions tailored to a nucleotide to reduce false positive and false negative readings. By including an attractive surface having dimensions tailored for a target analyte, a biosensor may reduce partial interactions between the target analyte (e.g., a nucleotide sequence) and a complimentary analyte (e.g., a complementary nucleotide sequence). For example, a target nucleotide pair may have a known length and flexibility. An attractive surface may be included such that only a single nucleotide pair may fit on the attractive surface. A first attractive surface and a second attractive surface may be separated by a distance based on the known length of the target nucleotide pair. For example, a first gold surface of an analyte-affinity layer may be separated from a second gold surface by a distance greater than a length of a target nucleotide pair. By limiting dimensions of the attractive surface (e.g., an upper surface of an analyte-affinity layer) such that only a single nucleotide pair may fit on the attractive surface, interactions with other nucleotide pairs may be limited and hybridization of the nucleotide pair may be improved. By separating attractive surfaces by a distance greater than a length of a target nucleotide pair, interactions between nucleotide pairs may be reduced. A method of forming a biosensor with an attractive surface tailored to reduce false readings is described below with reference to FIGS. 1-16B.

FIG. 1 is a cross-section view of a structure 100, in accordance with an embodiment of the present invention. The structure 100 may include a substrate 104. The substrate 104 may be composed of a semiconductor material, such as, for example, silicon.

Figure 2:
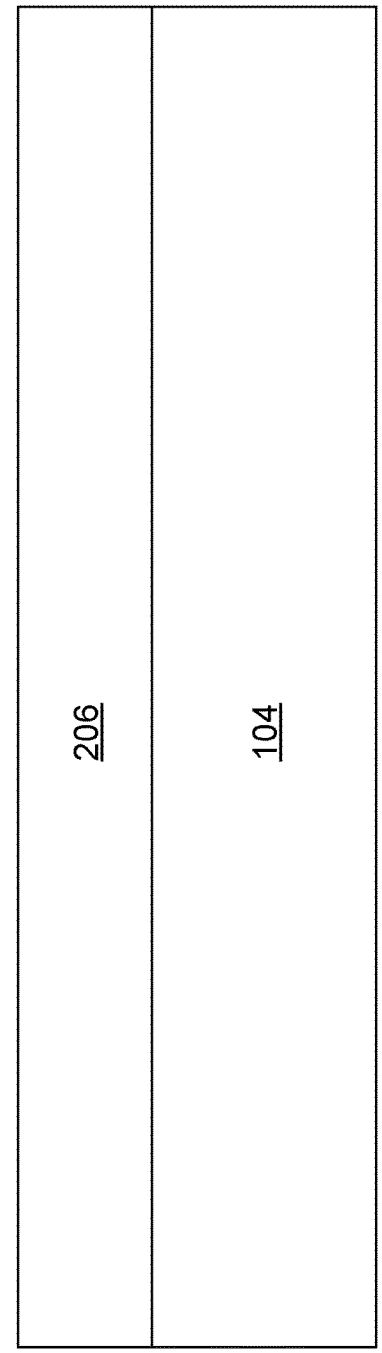
FIG. 2 is a cross-section view of forming a first photoresist layer on the structure, in accordance with an embodiment of the present invention.

FIG. 2 is a cross-section view of forming a first photoresist layer 206 on the structure, in accordance with an embodiment of the present invention. The first photoresist layer 206 may be formed using any conventional deposition method, such as, for example, atomic layer deposition (ALD), chemical vapor deposition (CVD), physical vapor deposition (PVD), plasma enhanced CVD (PECVD), molecular beam deposition (MBD), pulsed laser deposition (PLD), liquid source misted chemical deposition (LSMCD), or spin on deposition. In an embodiment, the first photoresist layer 206 may be composed of any light-sensitive material known in the art, such as, for example, polymethyl methacrylate (PMMA), polymethyl glutarimide (PMGI), or phenol formaldehyde (PF). In an embodiment, the first photoresist layer 206 may include a combination of materials, such as, for example, an upper light-sensitive layer and a lower lift-off layer.

Figure 3:
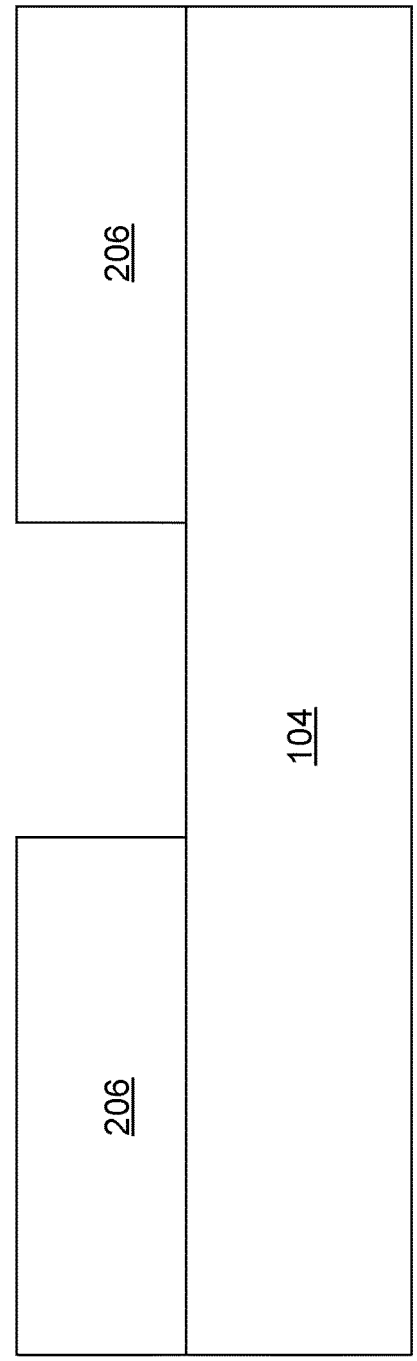
FIG. 3 is a cross-section view of removing a portion of the first photoresist layer, in accordance with an embodiment of the present invention.

FIG. 3 is a cross-section view of removing a portion of the first photoresist layer 206, in accordance with an embodiment of the present invention. The photoresist layer 206 may be removed using any conventional photolithography method, such as, for example, exposure to light and removal by a developer. The removed portion of the first photoresist layer 206 may expose an upper portion of the substrate 104. The removed portion of the first photoresist layer 206 may extend across a length of the substrate 104.

Figure 4:
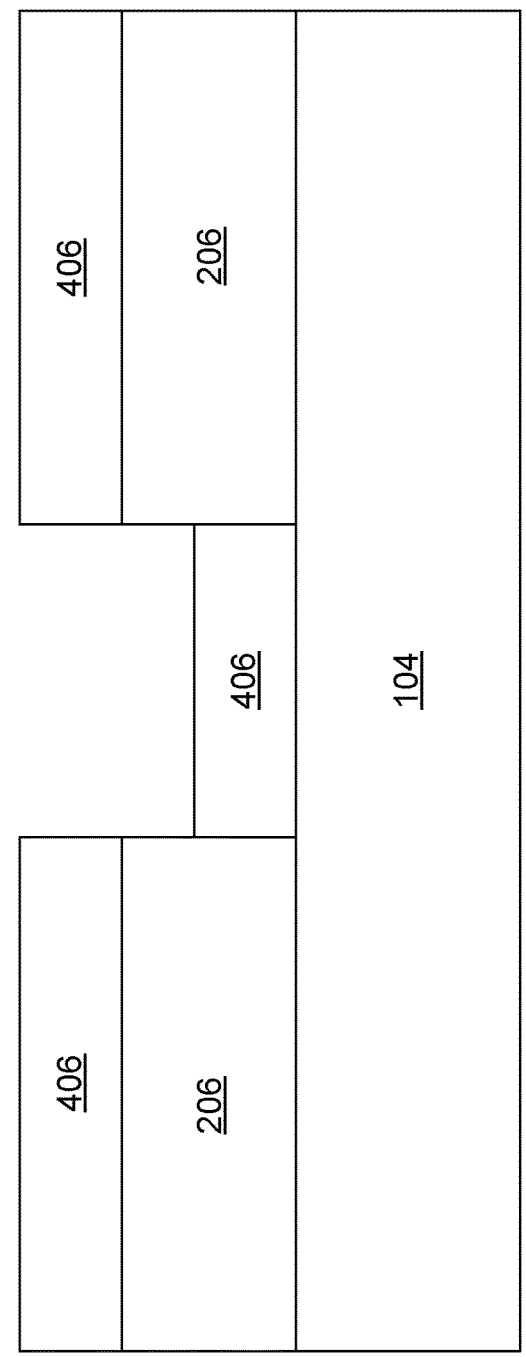
FIG. 4 is a cross-section view of forming a conductive layer, in accordance with an embodiment of the present invention.

FIG. 4 is a cross-section view of forming a conductive layer 406, in accordance with an embodiment of the present invention. The conductive layer 406 may be composed of any conductive material known in the art, such as, for example, gold or copper. A first portion of the conductive layer may be formed on an upper surface of the substrate 104. A second portion of the conductive layer 406 may be formed on an upper surface of the photoresist layer 206. The conductive layer 406 may be formed using any deposition method known in the art, such as, for example, spin on deposition.

Figure 5:
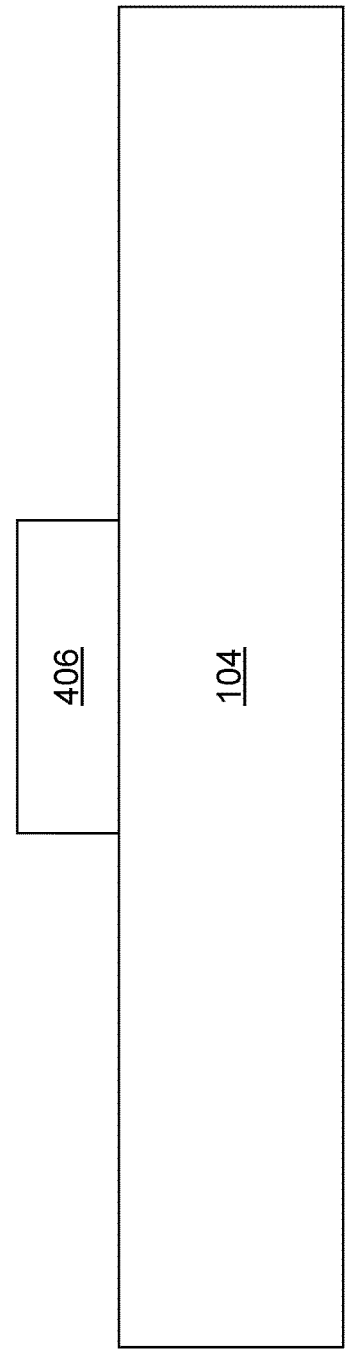
FIG. 5 is a cross-section view of removing a portion of the conductive layer and removing the first photoresist layer, in accordance with an embodiment of the present invention.

FIG. 5 is a cross-section view of removing the second portion of the conductive layer 406 and removing the first photoresist layer 206, in accordance with an embodiment of the present invention. The second portion of the conductive layer 406 may be removed by any material removal process known in the art, such as, for example, chemical mechanical planarization (CMP). The first photoresist layer 206 may be removed using any material removal process known in the art, such as, for example, exposure to light and removal by a developer.

Figure 6:
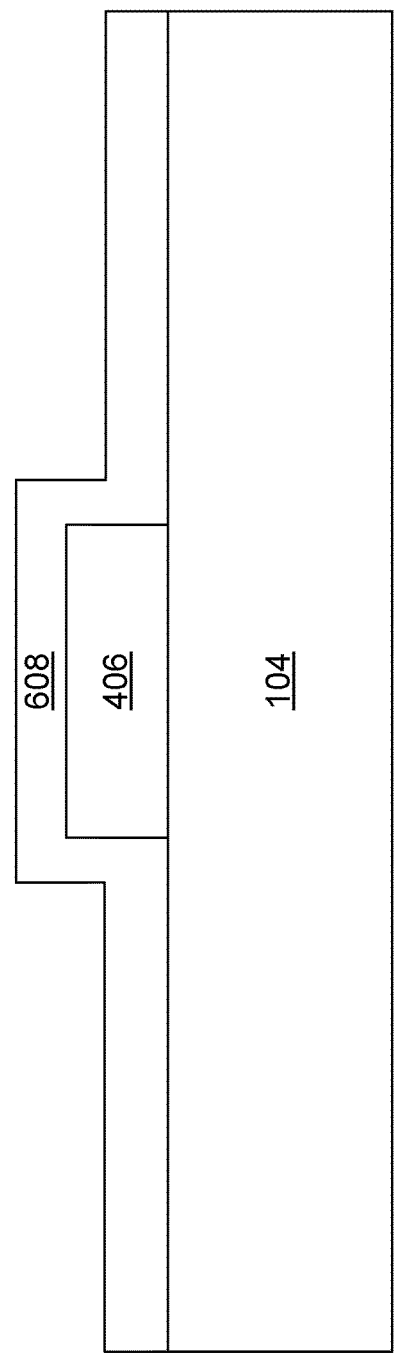
FIG. 6 is a cross-section view of forming a dielectric layer, in accordance with an embodiment of the present invention.

FIG. 6 is a cross-section view of forming a dielectric layer 208, in accordance with an embodiment of the present invention. The dielectric layer 208 may be formed on an upper surface of the substrate 104 and on an upper surface of the conductive layer 406. The dielectric layer 208 may cover the conductive layer 406 so that the conductive layer 406 has no exposed surfaces. The dielectric layer 208 may be formed by using any deposition method known in the art, such as, for example, ALD, CVD, PVD, PECVD, MBD, PLD, LSMCD, or spin on deposition.

Figure 7:
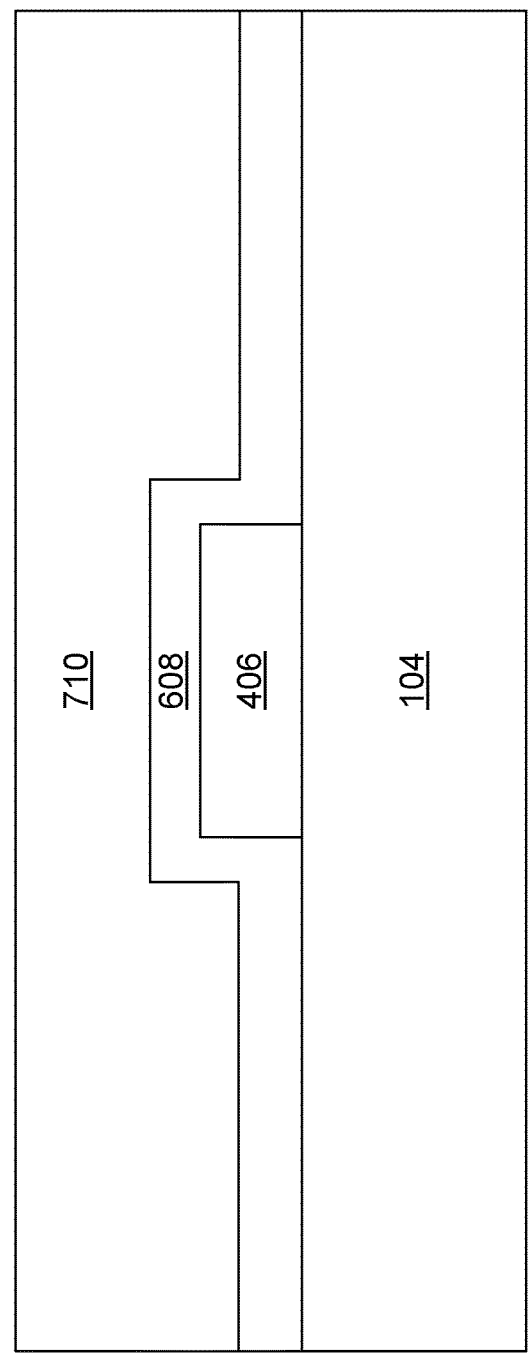
FIG. 7 is a cross-section view of forming a first hardmask layer, in accordance with an embodiment of the present invention.

FIG. 7 is a cross-section view of forming a first hardmask 710, in accordance with an embodiment of the present invention. The first hardmask 710 may be composed of any hardmask material, such as, for example, carbon. The first hardmask 710 may be formed using any deposition method known in the art, such as, for example, spin-on deposition. The first hardmask 710 may be referred to as a spin-on carbon (SoC) hardmask. The first hardmask 710 may be used in processing steps to improve an aspect ratio of certain features of the present invention, such as, for example, a size of an analyte-affinity layer, as demonstrated below with respect to FIGS. 12A-15B.

Figure 8:
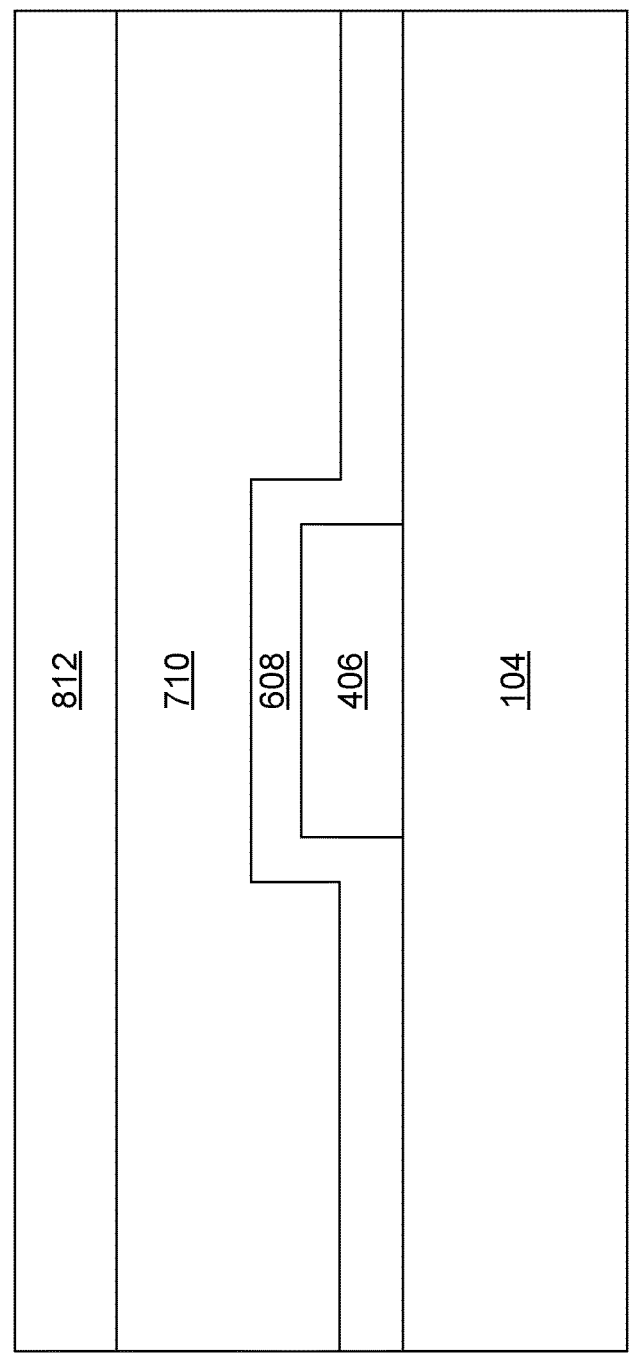
FIG. 8 is a cross-section view of forming a second hardmask layer, in accordance with an embodiment of the present invention.

FIG. 8 is a cross-section view of forming a second hardmask 812, in accordance with an embodiment of the present invention. The second hardmask 812 may be composed of any hardmask material, such as, for example, silicon oxide or silicon nitride. The second hardmask 812 may be formed on an upper surface of the first hardmask 710. The second hardmask 812 may be formed by using any deposition method known in the art, such as, for example, ALD, CVD, PVD, PECVD, MBD, PLD, LSMCD, or spin on deposition.

Figure 9:
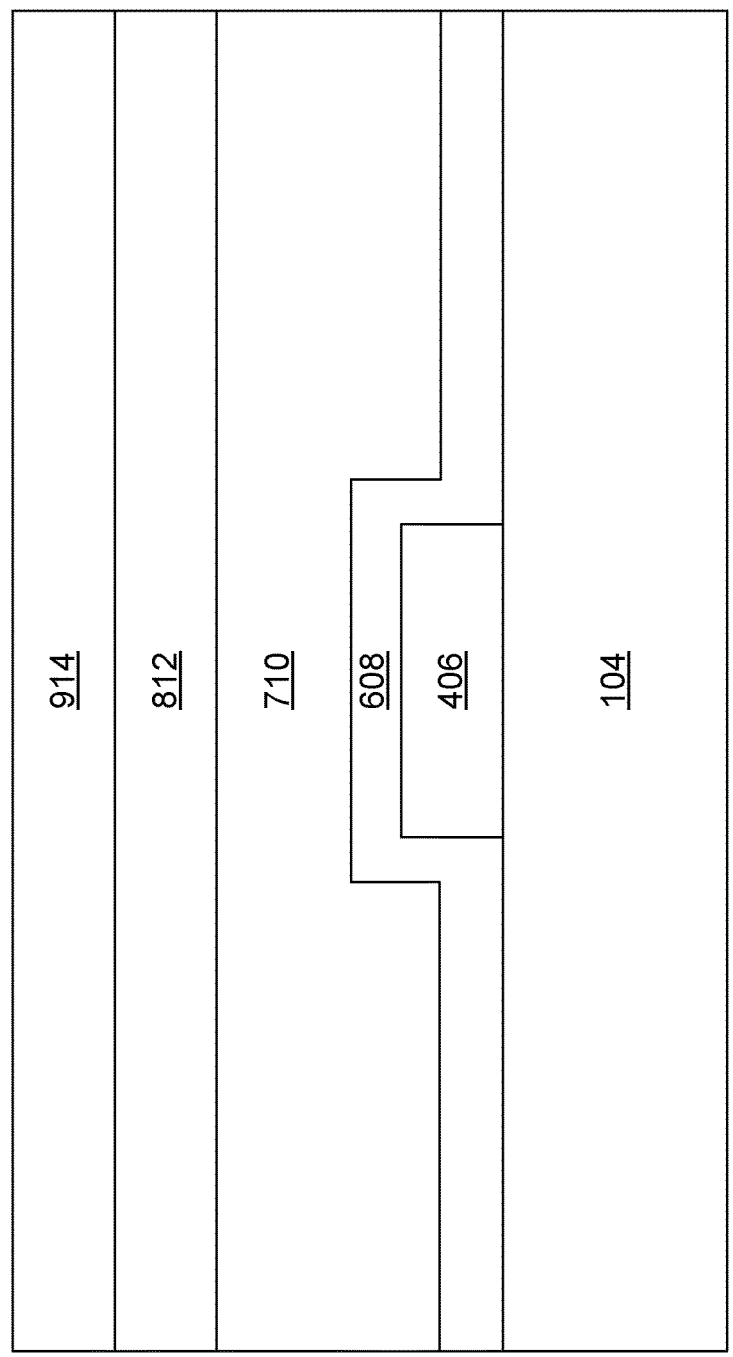
FIG. 9 is a cross-section view of forming a second photoresist layer, in accordance with an embodiment of the present invention.

FIG. 9 is a cross-section view of forming a second photoresist layer, in accordance with an embodiment of the present invention. The second photoresist layer 914 may be formed on an upper surface of the second hardmask 812. The second photoresist layer 914 may be formed using any conventional deposition method, such as, for example, ALD, CVD, PVD, PECVD, MBD, PLD, LSMCD, or spin on deposition. The second photoresist layer 914 may be composed of any light-sensitive material known in the art, such as, for example, polymethyl methacrylate (PMMA), polymethyl glutarimide (PMGI), or phenol formaldehyde (PF).

Figure 10B:
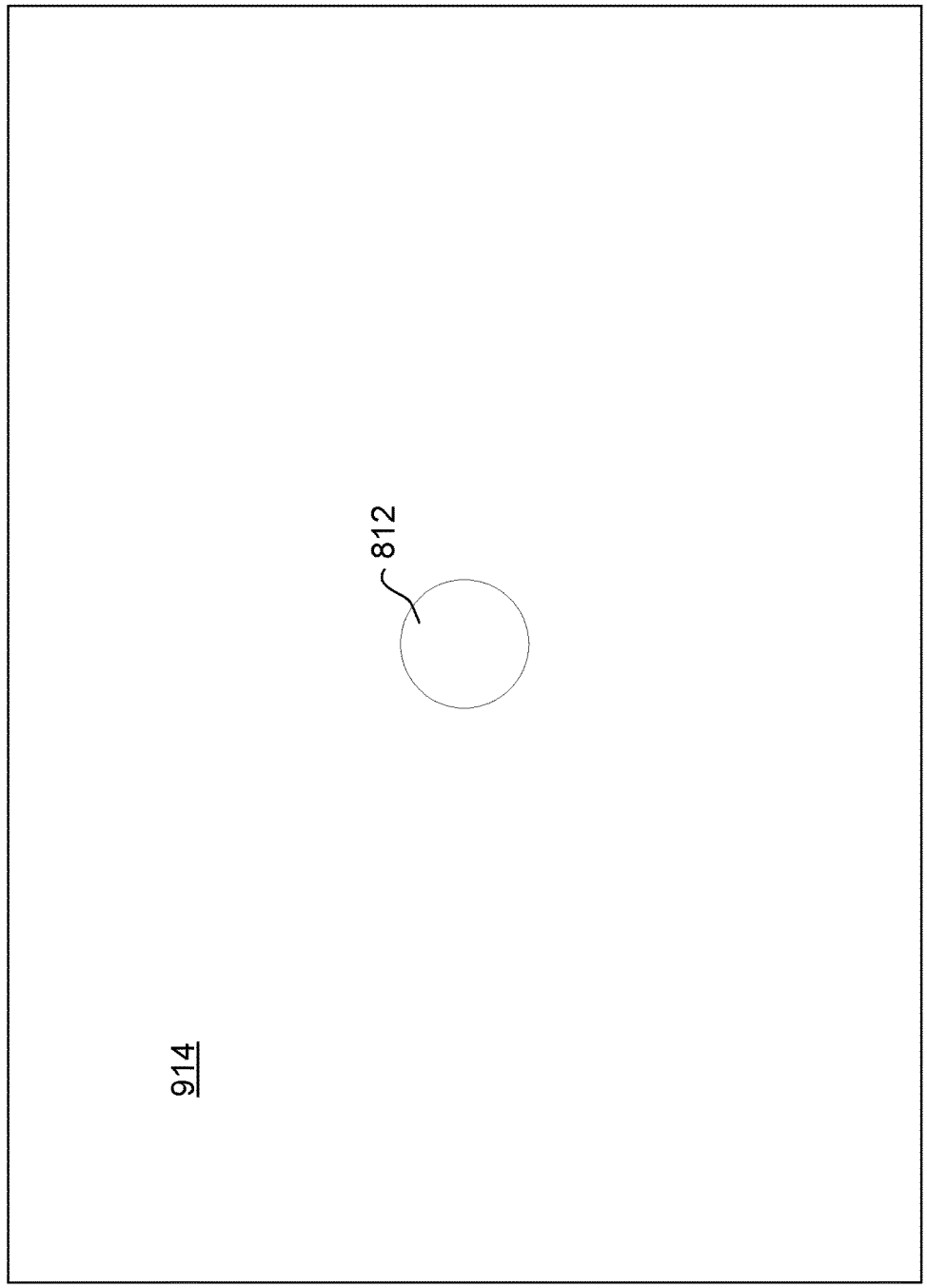

FIGS. 10A-10B are a cross-section view and a top view, respectively, of removing a portion of the second photoresist layer 914, in accordance with an embodiment of the present invention. The portion of the second photoresist 914 may be removed down to an upper surface of the second hardmask 812. In an embodiment, an exposed upper surface of the second hardmask 812 may have circular shape. The portion of the second photoresist 914 may be removed using any conventional material removal method, such as, for example, exposure to light and removal by a developer.

Figure 11A:
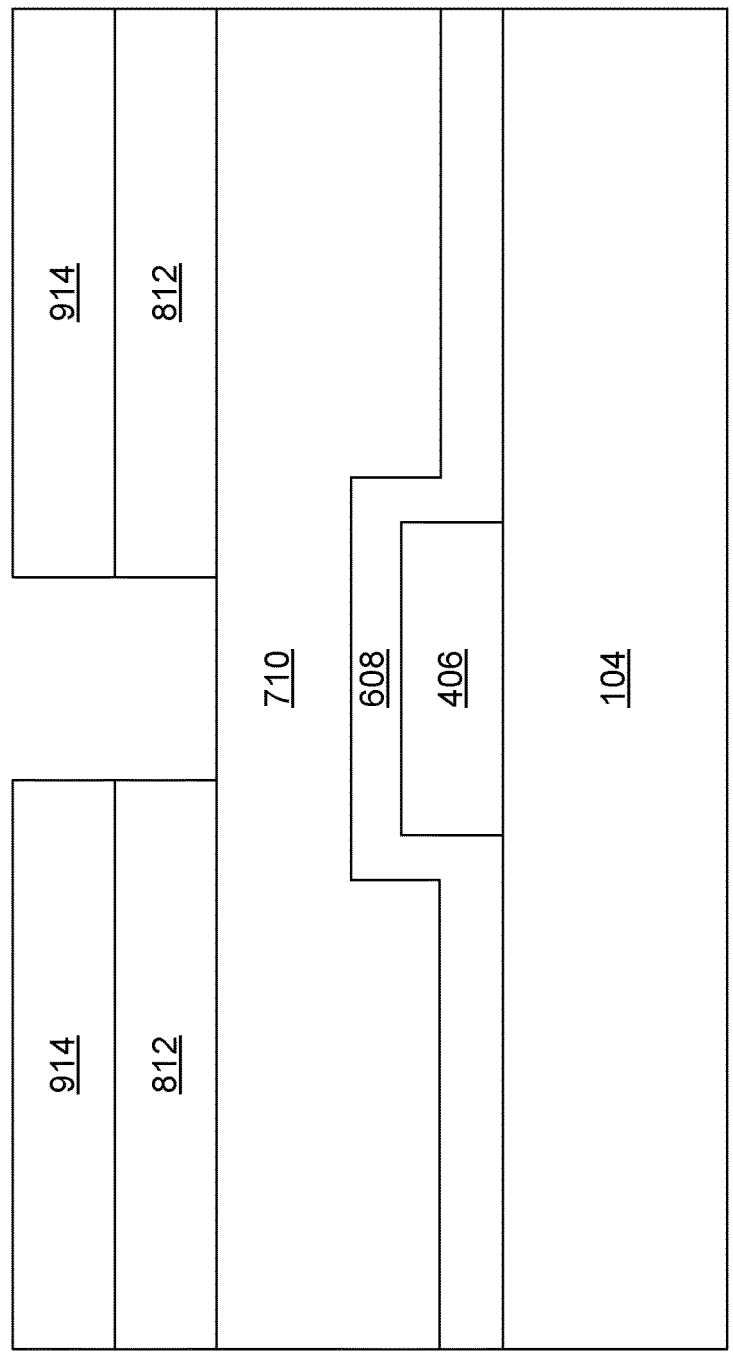
FIGS. 11A-11B are a cross-section view and a top view, respectively, of removing a portion of the hardmask layer, in accordance with an embodiment of the present invention.
Figure 11B:
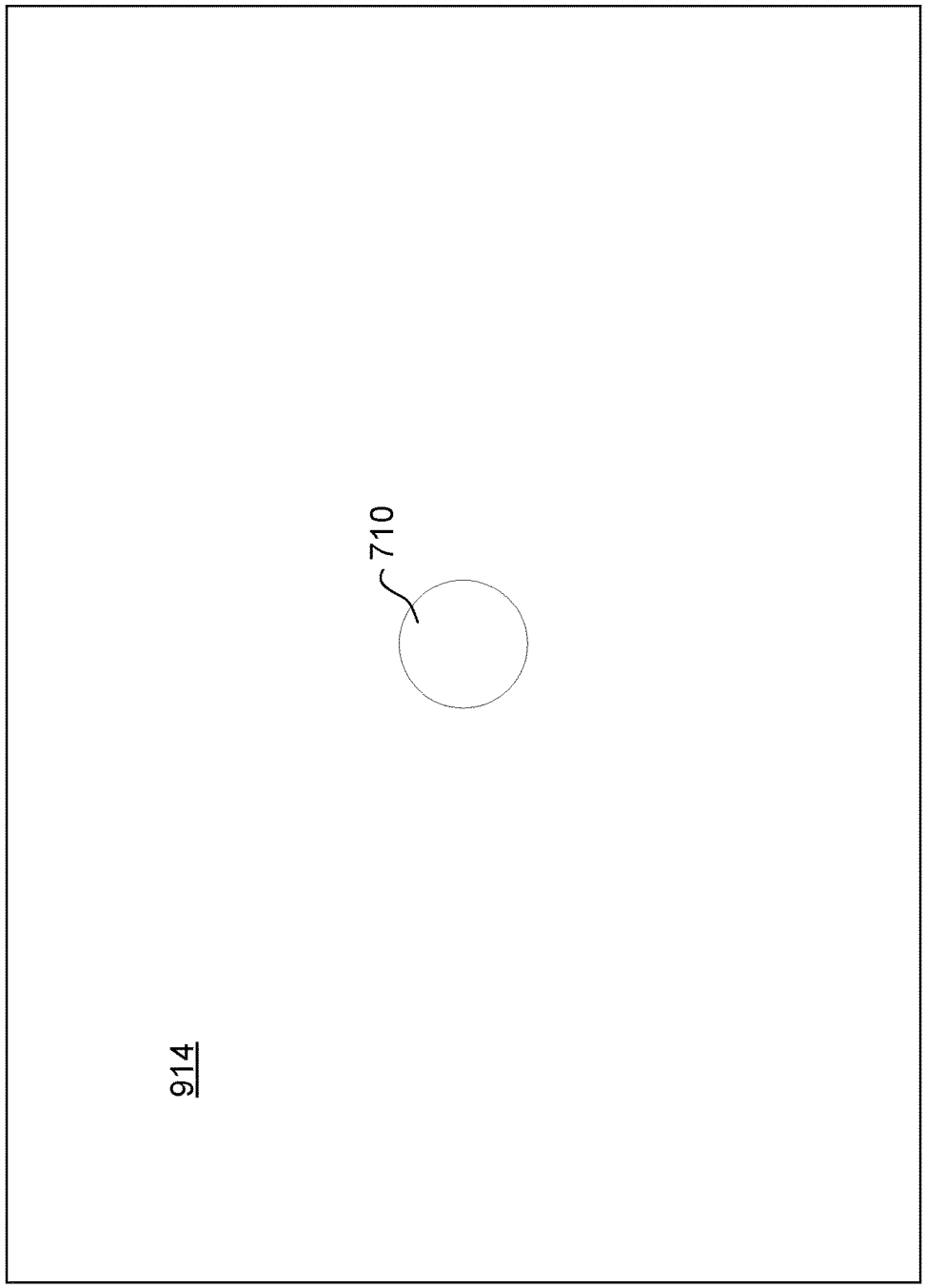

FIGS. 11A-11B are a cross-section view and a top view, respectively, of removing a portion of the second hardmask layer 812, in accordance with an embodiment of the present invention. The portion of the second hardmask layer 812 may be removed down to an upper surface of the first hardmask 710. An exposed upper surface of the first hardmask 710 may have a circular shape. The portion of the second hardmask layer 812 may be removed using a material removal process known in the art, such as, for example, a selective etching process.

Figure 12A:
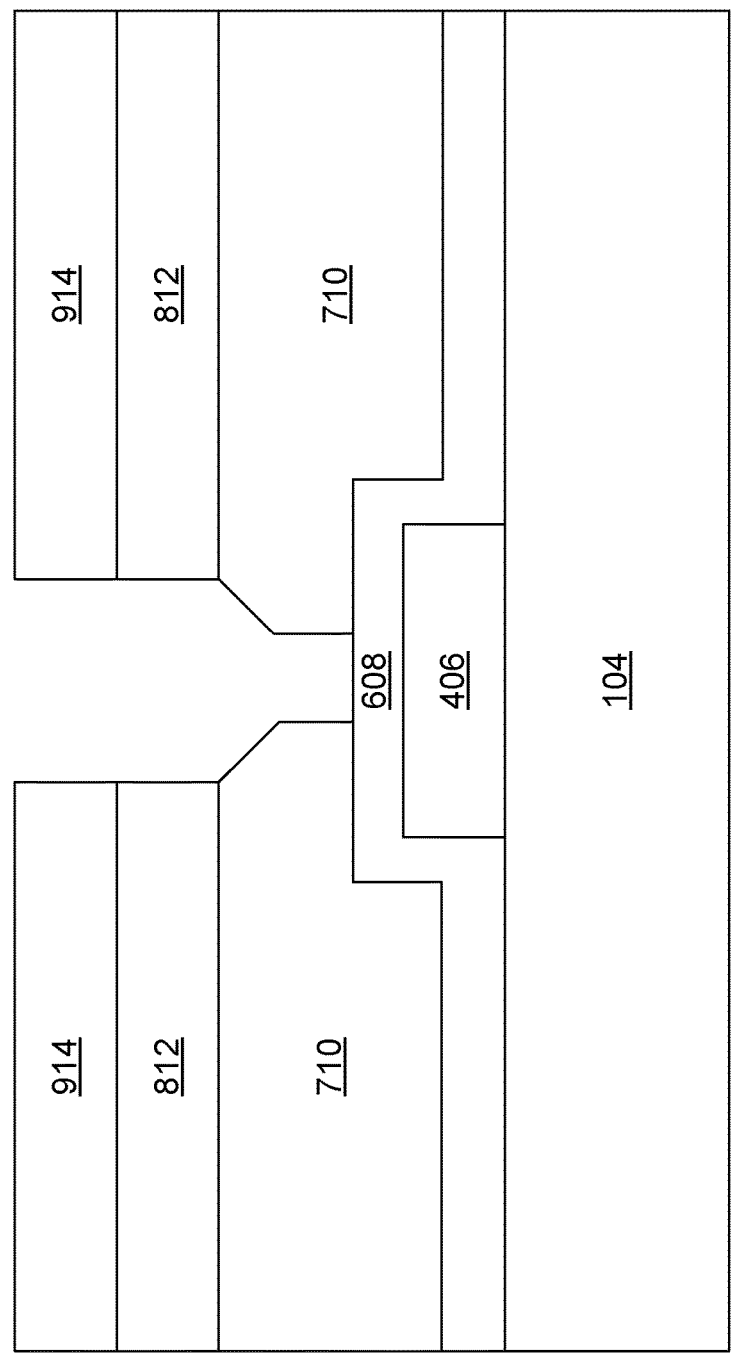
FIGS. 12A-12B are a cross-section view and a top view, respectively, of removing a portion of the carbon layer, in accordance with an embodiment of the present invention.
Figure 12B:
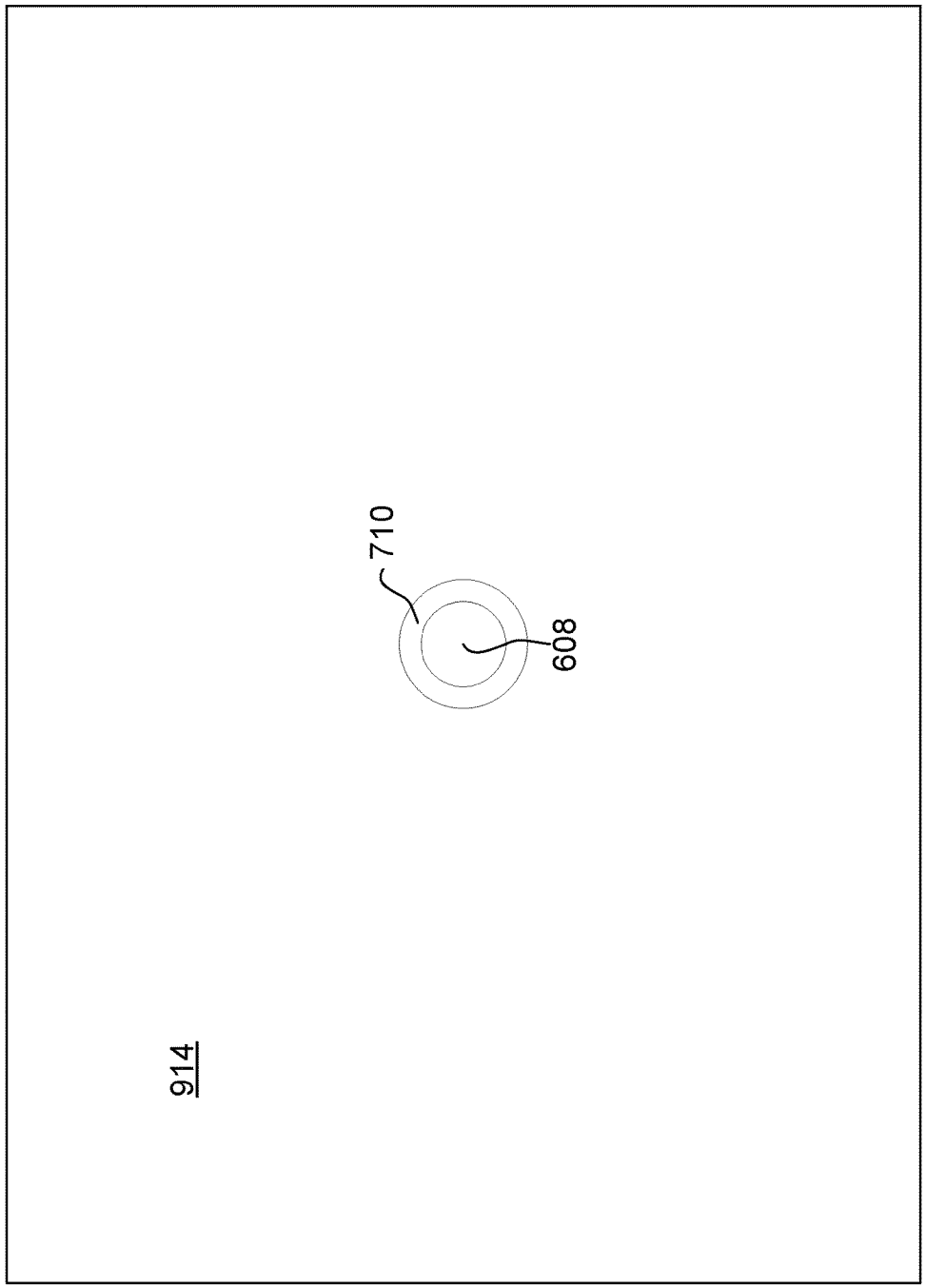

FIGS. 12A-12B are a cross-section view and a top view, respectively, of removing a portion of the first hardmask 710, in accordance with an embodiment of the present invention. In an embodiment, the second photoresist layer 914 may be removed during a same material removal process as the portion of the first hardmask 710 (not shown). In another embodiment, the second photoresist layer 914 may be removed during a material removal process other than the material removal process used to remove the portion of the first hardmask 710, as described with respect to FIGS. 14A-14B. The portion of the first hardmask 710 may be removed using a material removal process known in the art, such as, for example, reactive ion etching. The portion of the first hardmask 710 may be removed down to an upper surface of the dielectric layer 608. Removing the portion of the first hardmask 710 may result in an opening through the first hardmask 710 down to the upper surface of the dielectric layer 608. The opening through the first hardmask 710 may be tapered such that an upper region of the opening has a larger area than a lower region of the opening. By forming an opening with a smaller area in a lower region, an analyte-affinity layer may be formed having a smaller area in subsequent fabrication steps, discussed below with reference to FIGS. 15A-15B.

Figure 13A:
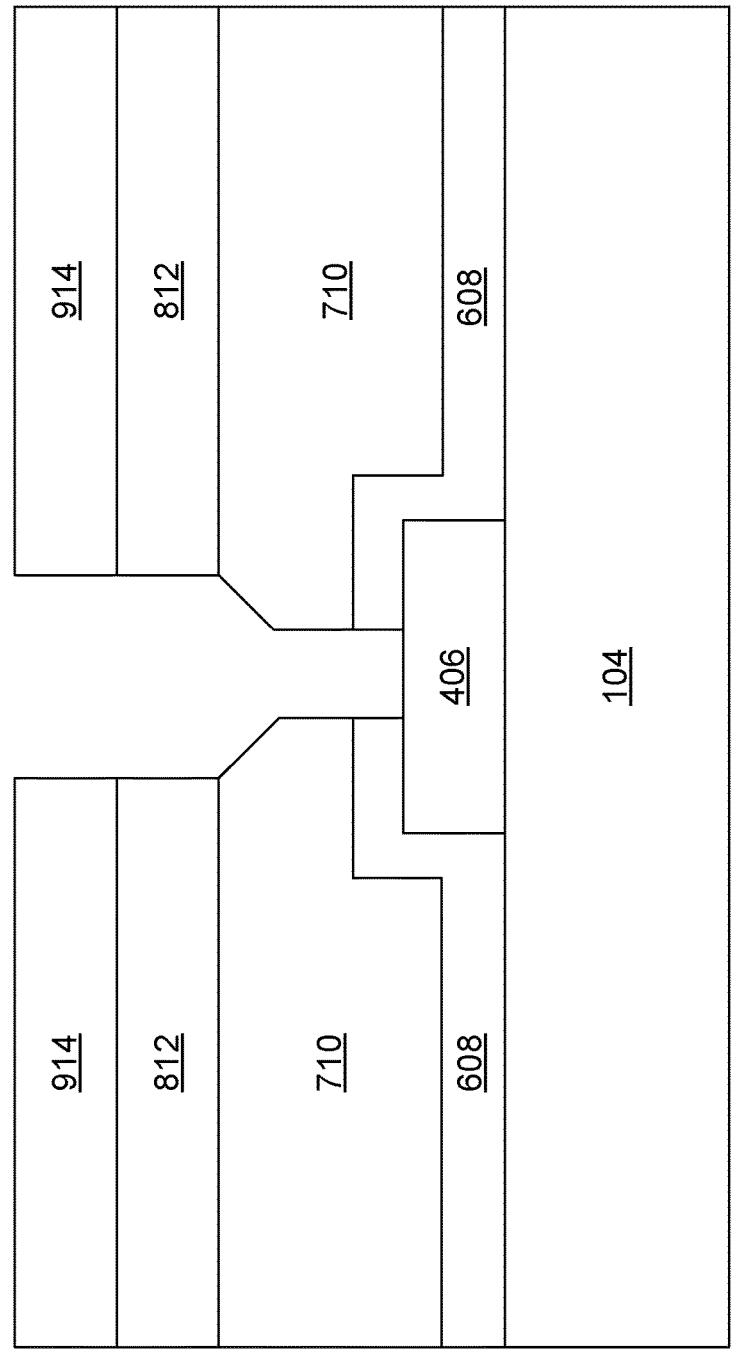
FIGS. 13A-13B are a cross-section view and a top view, respectively, of removing a portion of the dielectric layer, in accordance with an embodiment of the present invention.
Figure 13B:
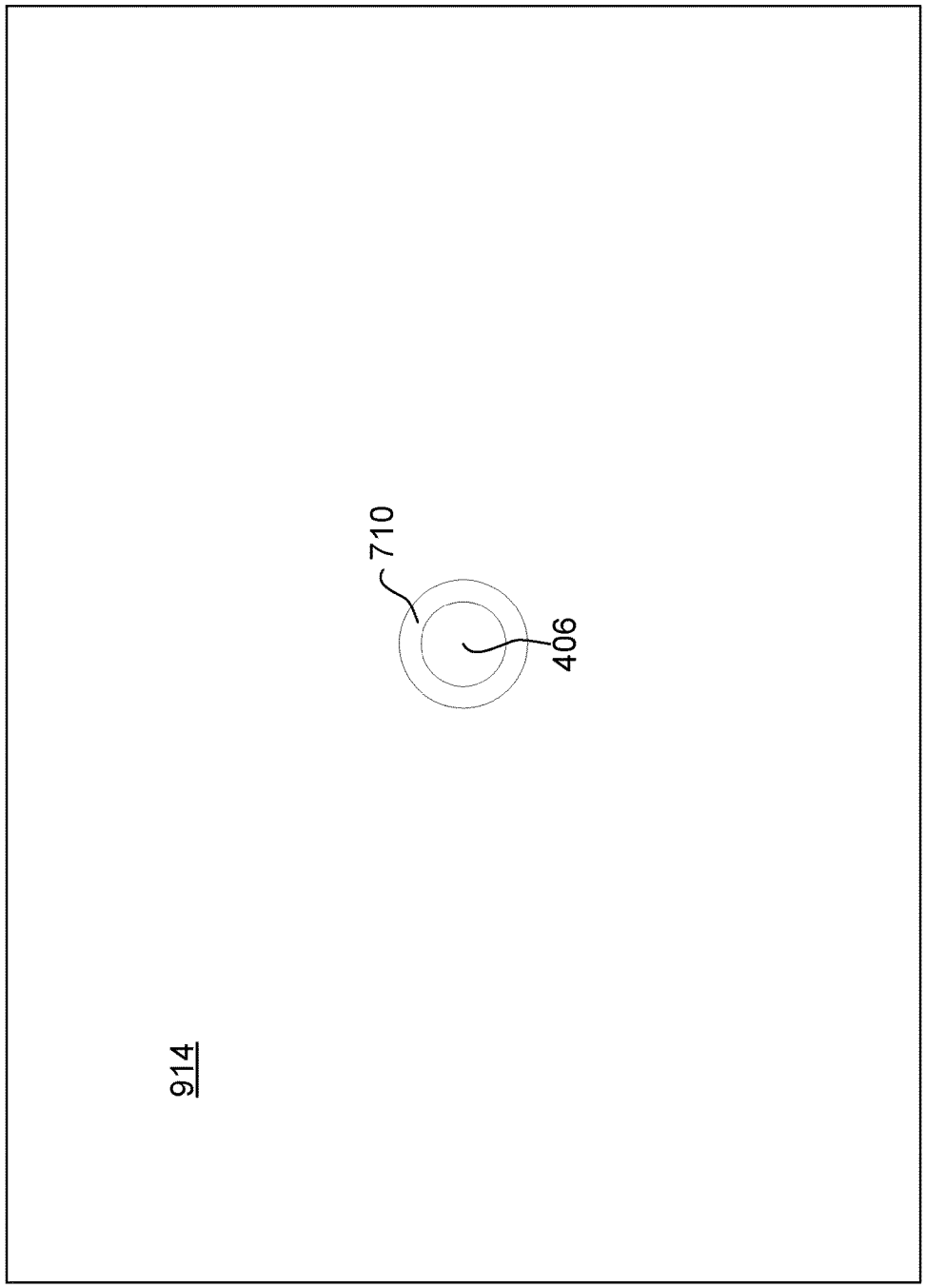

FIGS. 13A-13B are a cross-section view and a top view, respectively, of removing a portion of the dielectric layer 608, in accordance with an embodiment of the present invention. The portion of the dielectric layer 608 may be removed down to an upper surface of the conductor layer 406. An exposed upper surface of the conductor layer 406 may have a circular shape. The portion of the dielectric layer 608 may be removed by a material removal process known in the art, such as, for example, a selective etch.

Figure 14A:
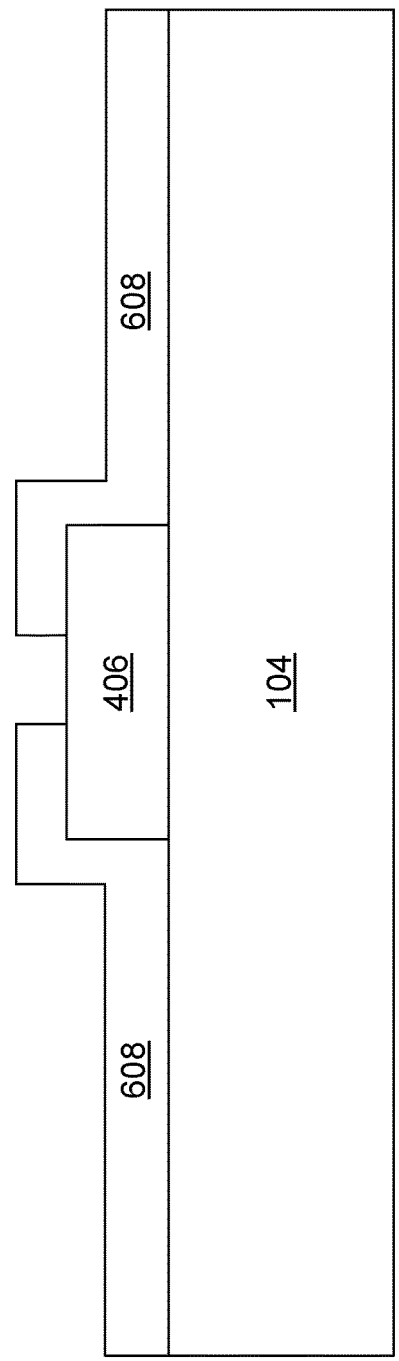
FIGS. 14A-14B are a cross-section view and a top view, respectively, of removing the second photoresist layer, removing the hardmask layer, and removing the carbon layer, in accordance with an embodiment of the present invention.
Figure 14B:
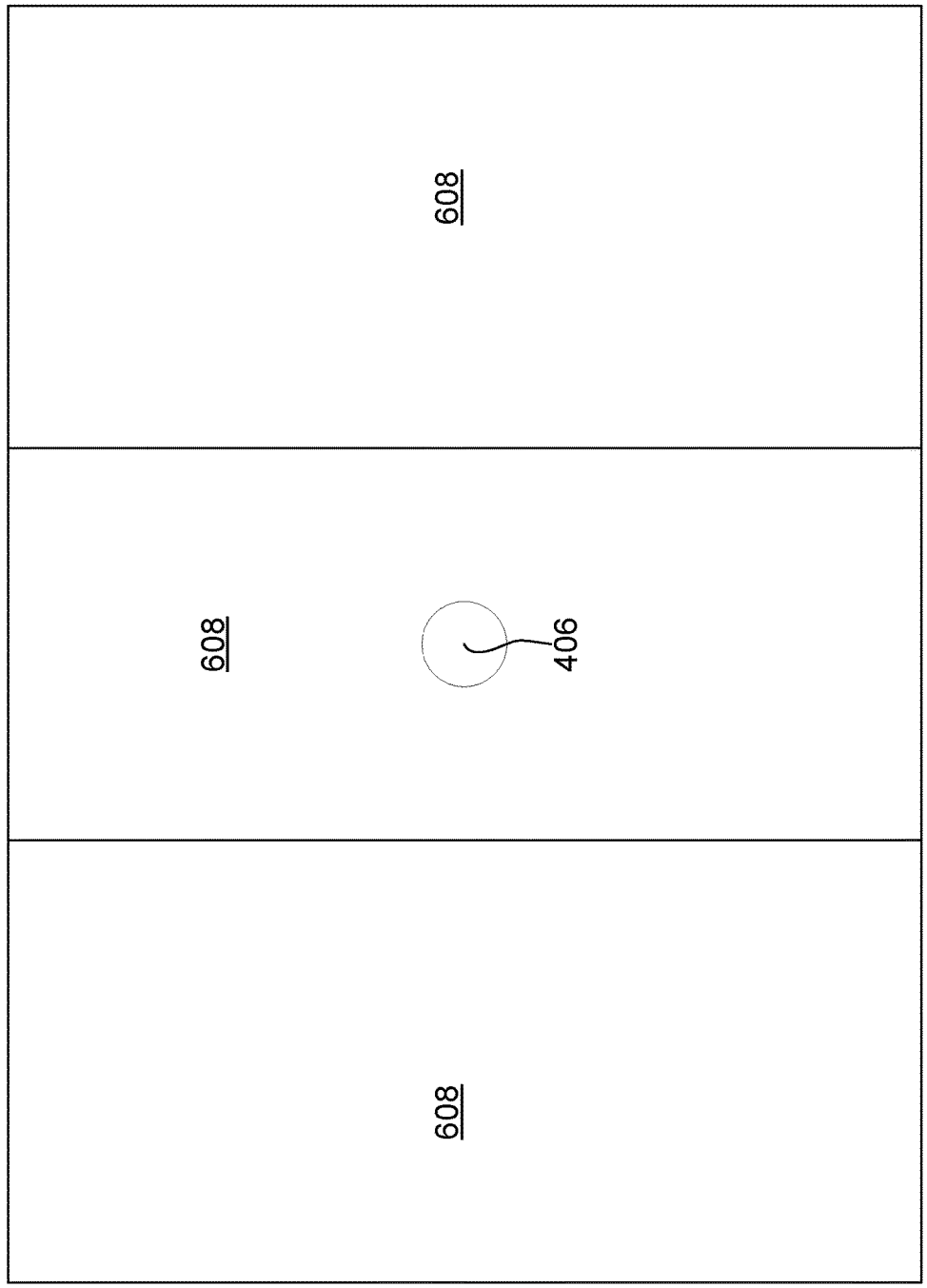

FIGS. 14A-14B are a cross-section view and a top view, respectively, of removing the second photoresist layer 914, removing the second hardmask 812, and removing the first hardmask 710, in accordance with an embodiment of the present invention. The second photoresist layer 914 may be removed by a conventional material removal process, such as, for example, exposure to light and removal by a developer. The second harmask 812 and the first hardmask 710 may be removed by a conventional material removal process, such as, for example, reactive ion etching. The first hardmask 710 may be removed down to an upper surface of the dielectric layer 608.

Figure 15A:
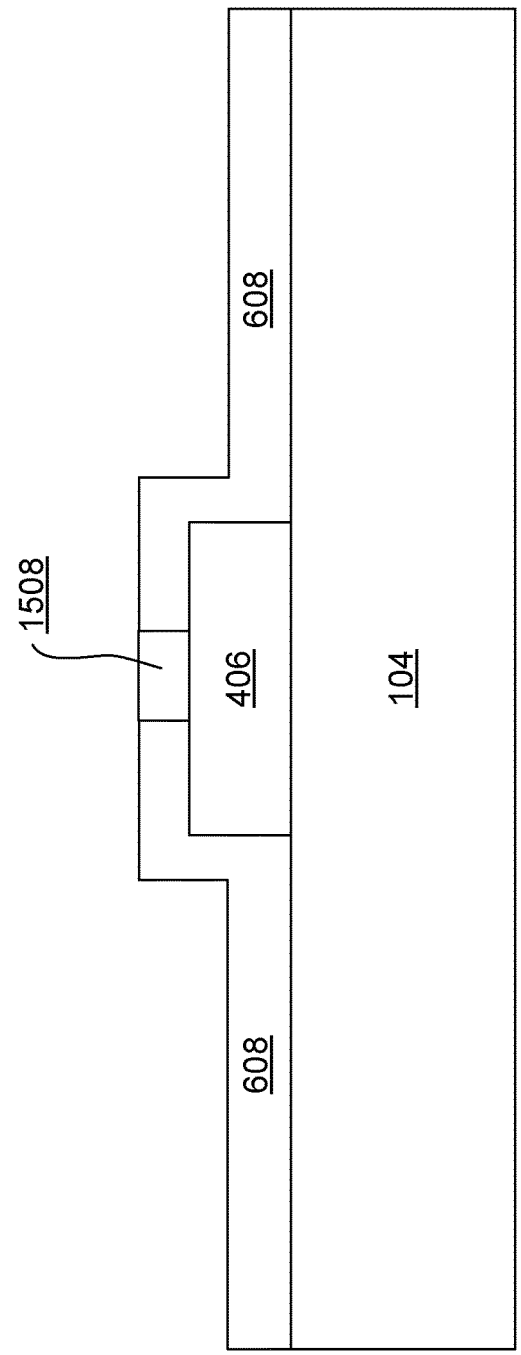
FIGS. 15A-15B are a cross-section view and a top view, respectively, of forming an analyte-affinity layer, in accordance with an embodiment of the present invention.
Figure 15B:
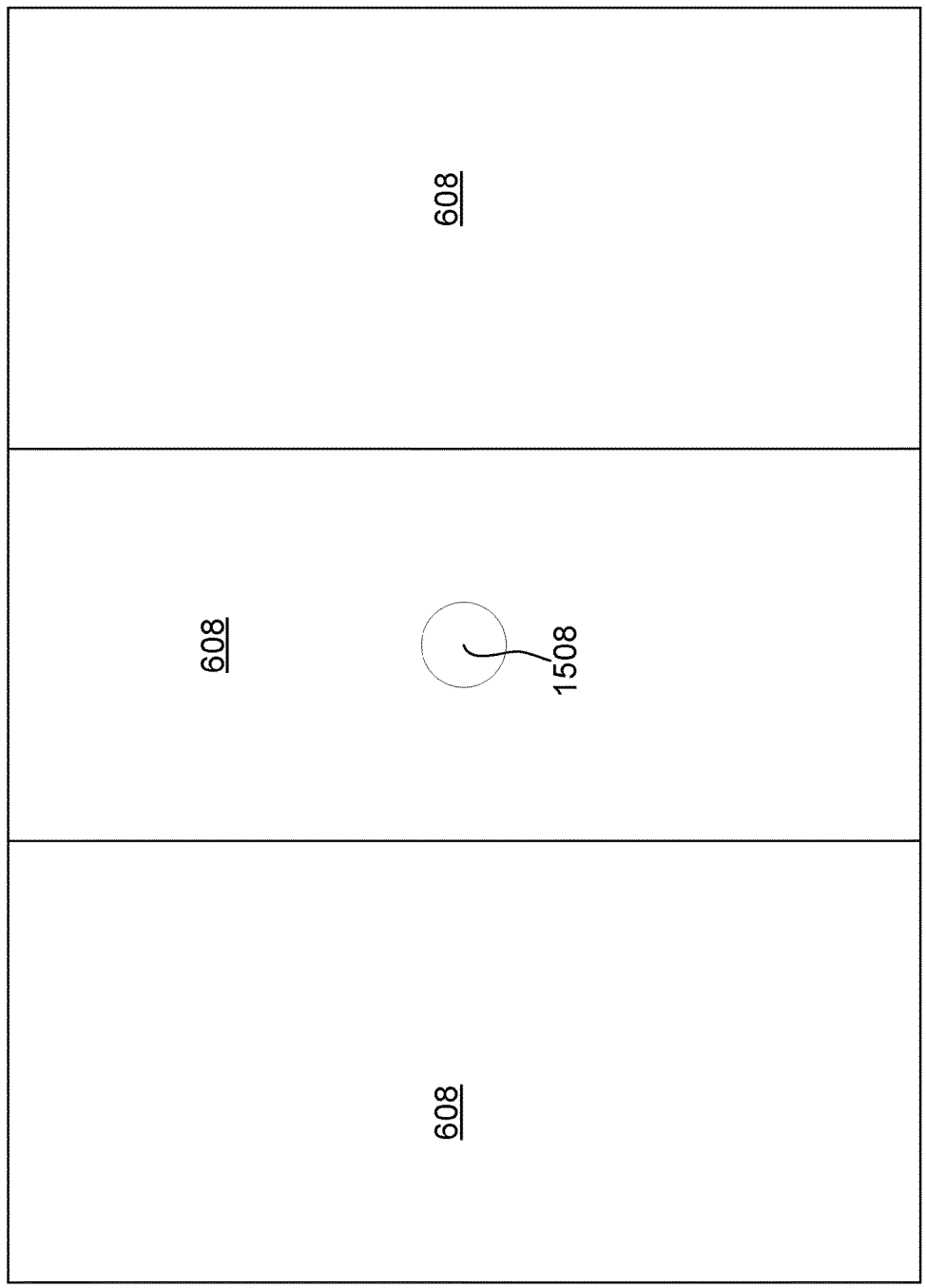

FIGS. 15A-15B are a cross-section view and a top view, respectively, of forming an analyte-affinity layer 1508 on the top surface of the conductor layer 406, in accordance with an embodiment of the present invention. In an embodiment, an upper surface of the analyte-affinity layer 1508 may attract an analyte (e.g., a nucleotide sequence in a solution above the analyte-affinity layer 1508). In another embodiment, the analyte-affinity layer 1508 may be omitted and an upper surface of the conductor layer 406 may serve the function of the upper surface of the analyte-affinity layer 1508 by attracting an analyte (e.g., a nucleotide sequence in a solution above the conductor layer 406). Embodiments contemplate the analyte-affinity layer 1508 and the conductive layer 406 being independent or indistinct layers. The analyte-affinity layer 1508 may be formed using a conventional method, such as, for example, spin on deposition. The analyte-affinity layer 1508 may be composed of any material known to attract a target analyte. For example, the analyte-affinity layer 106 may be composed of gold to attract a target analyte (e.g., a nucleotide sequence or protein).

The analyte-affinity layer 1508 may be formed on an upper surface of the conductor layer 406. The analyte-affinity layer 1508 may be formed in an opening of the dielectric layer 608. The analyte-affinity layer 1508 may have a cylindrical shape with an approximately flat upper surface and approximately flat lower surface. The upper surface of the analyte-affinity layer 1508 may have a diameter ranging from approximately 2 nm to approximately 20 nm, and ranges therebetween. For example, the upper surface of the remaining cylindrical portion of the analyte-affinity layer 106 may be approximately 6 nm.

Figure 16B:
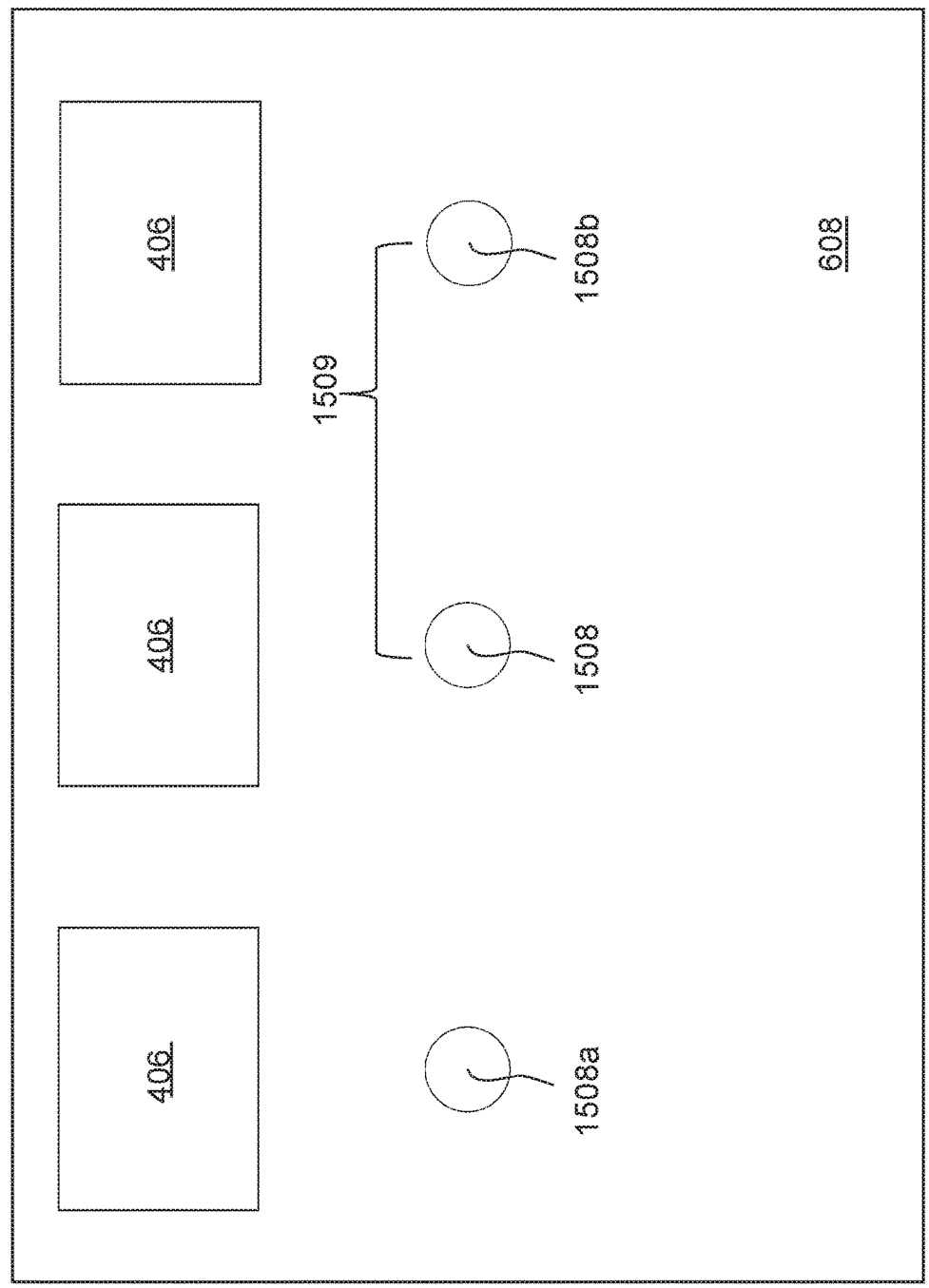

FIGS. 16A-16B are a cross-section view and a top view, respectively, of removing a portion of dielectric layer 608 (See FIG. 16B), in accordance with an embodiment of the present invention. The portion of the dielectric layer 608 may be removed down to another upper surface of the conductive layer 406. The exposed surface of the conductive layer 406 may be connected to one or more wiring layers connected to a transistor device to detect electrical current changes in the conductive layer 406. For example, an analyte may come in contact with the upper surface of the analyte-affinity layer 1508 resulting in a current change in the conductive layer 406. The current change in the conductive layer 406 may be detected by one or more devices electrically connected to the exposed upper surface of the wiring layer 406.

By including the conductive layer 406 under the analyte-affinity layer 1508 and electrically connecting the conductive layer 406 to one or more devices, analyte contact with the upper surface of the analyte-affinity layer 1508 may be detected. In an embodiment, the one or more devices electrically connected to the conductive layer 406 may include one or more of a field effect transistor (FET), bipolar junction transistor (BJT), insulated-gate bipolar transistor (IGBT), or any other transistor known in the art. Non-limiting examples of a FET include a junction gate field-effect transistor (JFET), a metal-oxide-semiconductor field-effect transistor (MOSFET), and a tunnel field-effect transistor (TFET). In an embodiment, the one or more devices electrically connected to the conductive layer 406 may include any electrical device known in the art, such as, for example, a diode, transistor, amplifier, rectifier, thyristor, or any combination thereof. In an embodiment, the one or more devices electrically connected to the conductive layer 406 may be formed as part of the structure 100 or as a separate structure having one or more wiring layers connecting to the conductive layer 406. For example, the structure 100 may be formed on an upper surface of a FET structure where a gate of the FET may be in contact with the conductive layer 406. In another example, the structure 100 may be formed adjacent to a FET structure and one or more wiring layers may electrically connect the FET structure to the structure 100.

In an embodiment, more than one analyte-affinity layer having a conductive layer connected to another device may be formed. For example, a biosensor may include a several analyte-affinity layers with conductive layers below connected to one or more analyte detection devices (e.g., electrically connected to a transistor). In an embodiment, the analyte-affinity layers may be formed in parallel or series. For example, the analyte-affinity layers may be formed in parallel having independent conductive layers. In an example, the analyte-affinity layers may be formed in groups in parallel where more than one upper surface of one or more analyte-affinity layer(s) share a common conductor layer adjacent to one or more analyte affinity layer(s) having independent conductive layers. Embodiments contemplate the analyte-affinity layer and the conductive layer being independent or indistinct layers.

In an embodiment, a biosensor having one or more analyte-affinity layers may be used to detect one or more target analytes. For example, the biosensor may be used to detect a nucleotide sequence. The analyte-affinity layer 1508 may attract the nucleotide sequence and/or enable more complete nucleotide hybridization by holding corresponding nucleotide sequences within proximity to one another. An upper surface of the dielectric layer 608 (e.g., composed of silicon oxide) may repel the nucleotide sequence. Due to the small area of the upper surface the analyte-affinity layer 1508 (e.g., approximately 28 square nm), only a single pair of nucleotides may attach to the upper surface of the analyte-affinity layer 1508. For example, the upper surface the analyte-affinity layer 1508 may have a diameter ranging from approximately 2 nm to approximately 20 nm, and ranges therebetween. For example, the upper surface of the remaining cylindrical portion of the analyte-affinity layer 106 may be approximately 6 nm. A length of a nucleotide sequence may be used to determine a diameter of the upper surface of the analyte-affinity layer 1508. For example, if a target analyte is a nucleotide sequence having 15 base pairs, the upper surface of the analyte-affinity layer 1508 may have a diameter ranging from approximately 3 nm to approximately 5 nm. In another example, if a target analyte is a nucleotide sequence having 50 base pairs, the upper surface of the analyte-affinity layer 1508 may have a diameter ranging from approximately 5 nm to approximately 15 nm.

In embodiments contemplating more than one analyte-affinity layers 1508, as shown in FIG. 16B as 1508, 1508*a*, and 1508*b*, a distance 1509 may separate a first analyte-affinity layer from a second analyte-affinity layer. In an embodiment, the distance 1509 between the first analyte-affinity layer and the second analyte-affinity layer may range from approximately 50% a length of a target analyte to approximately 300% a length of a target analyte. Since the first analyte-affinity layer and the second analyte-affinity layer may be separated by the distance 1509, a target analyte may only adhere to analyte-affinity layer. In addition, the dielectric layer 608 may be composed of silicon oxide which may repel particular analytes (e.g., a nucleotide sequence). By including isolated analyte-attracting points (e.g., any analyte-affinity layer 1508) separated by an analyte repelling region (e.g., an upper surface of the dielectric layer 608), analyte adhesion to the surface of the biosensor may be more precisely controlled and measured than previously possible with conventional devices. In addition, by including the conducting layer 406 below any analyte-affinity layer 1508, an analyte in contact with any analyte-affinity layer 1508 may be identified and measured.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure having a nucleotide attracting surface formed to reduce false detection of nucleotides, the structure comprising:
    a conductive layer on an upper surface of a substrate extending a length of the substrate;
    a cylindrical nucleotide attracting structure comprising a first end and a second end, the first end is in direct contact with an upper surface of the conductive layer and the second end is expose to the atmosphere, the cylindrical nucleotide attracting structure comprises a nucleotide attracting material; and
    a dielectric layer on an upper surface of the substrate, on an upper surface of the conductive layer, and in direct contact with a vertical surface of the cylindrical nucleotide attracting structure.

2. The structure of claim 1, wherein the nucleotide attracting material comprises gold.

3. The structure of claim 1, wherein an upper surface of the cylindrical nucleotide attracting structure is flush with an upper surface of the dielectric layer.

4. The structure of claim 1, wherein the target analyte is a nucleotide sequence comprising a number of base pairs, wherein the number of base pairs ranges from 15 to 50 base pairs.

5. A structure comprising:
    two or more conductive layers on an upper surface of a substrate extending a length of the substrate;
    two or more cylindrical nucleotide attracting structures each comprising a first end and a second end, the first end of each cylindrical nucleotide attracting structure is in direct contact with an upper surface of respective conductive layers and the second end of each cylindrical nucleotide attracting structure is expose to the atmosphere, the two or more cylindrical nucleotide attracting structure are made from a nucleotide attracting material; and
    a dielectric layer on an upper surface of the substrate, on an upper surface of the two or more conductive layers, and in direct contact with vertical surfaces of the two or more cylindrical nucleotide attracting structures, the dielectric layer separates the two or more conductive layers from each other.

6. The structure of claim 5, wherein the nucleotide attracting material comprises gold.

7. The structure of claim 6, wherein an upper surface of the cylindrical nucleotide attracting structure is flush with an upper surface of the dielectric layer.

8. The structure of claim 6, wherein the target analyte is a nucleotide sequence comprising a number of base pairs, wherein the number of base pairs ranges from 15 to 50 base pairs.

9. The structure of claim 6, wherein a distance between the two or more cylindrical nucleotide attracting structures ranges from approximately 50% of a length of a target analyte to approximately 300% of the length of the target analyte, wherein the target analyte is a nucleotide sequence comprising a number of base pairs, wherein the number of base pairs ranges from 15 to 50 base pairs.

10. The structure of claim 6, a semiconductor device arranged directly on top of the conductive layer and in electrical contact with the cylindrical nucleotide attracting structure, wherein the semiconductor device detects a voltage change based on a target analyte contacting the exposed surface of the cylindrical nucleotide attracting structure.

11. The structure of claim 6, wherein portions of the dielectric layer are in direct contact with portions of the substrate located between adjacent conductive layers.

12. A structure comprising:
    a conductive layer on an upper surface of a substrate;
    a cylindrical nucleotide attracting structure comprising a first end and a second end, the first end is in direct contact with an upper surface of the conductive layer and the second end is expose to the atmosphere, the cylindrical nucleotide attracting structure comprises a nucleotide attracting material;
    a dielectric layer on an upper surface of the substrate, on an upper surface of the conductive layer, and is in direct contact with a vertical surface of the cylindrical nucleotide attracting structure; and
    a semiconductor device arranged directly on top of the conductive layer and in electrical contact with the cylindrical nucleotide attracting structure, wherein the semiconductor device detects a voltage change based on a target analyte contacting the exposed surface of the cylindrical nucleotide attracting structure.

13. The structure of claim 12, wherein the nucleotide attracting material comprises gold.

14. The structure of claim 13, wherein an upper surface of the cylindrical) nucleotide attracting structure is flush with an upper surface of the dielectric layer.

15. The structure of claim 13, wherein the target analyte is a nucleotide sequence comprising a number of base pairs, wherein the number of base pairs ranges from 15 to 50 base pairs.

16. The structure of claim 13, wherein a distance between the two or more cylindrical nucleotide attracting structures ranges from approximately 50% of a length of a target analyte to approximately 300% of the length of the target analyte, wherein the target analyte is a nucleotide sequence comprising a number of base pairs, wherein the number of base pairs ranges from 15 to 50 base pairs.

* * * * *